(12) United States Patent
Jaffe

(10) Patent No.: US 6,320,807 B1
(45) Date of Patent: Nov. 20, 2001

(54) APPARATUS AND METHOD FOR A HIGH-SPEED MEMORY

(75) Inventor: James Jaffe, Santa Clara, CA (US)

(73) Assignee: RealChip, Inc., Sunnyvale, CA (US)

( * ) Notice: Subject to any disclaimer, the term of this patent is extended or adjusted under 35 U.S.C. 154(b) by 0 days.

(21) Appl. No.: 09/528,143

(22) Filed: Mar. 17, 2000

(51) Int. Cl.[7] .................................................. G11C 7/00
(52) U.S. Cl. ...................... 365/203; 365/222; 365/230.06
(58) Field of Search .................................... 365/203, 205, 365/207, 230.06, 222

(56) References Cited

U.S. PATENT DOCUMENTS

| | | | | |
|---|---|---|---|---|
| 5,751,651 | * | 5/1998 | Ooishi | 365/226 |
| 5,822,264 | * | 10/1998 | Tomishima et al. | 365/222 |
| 6,038,634 | * | 3/2000 | Ji et al. | 711/5 |

\* cited by examiner

*Primary Examiner*—Vu A. Le
*Assistant Examiner*—Hien Nguyen
(74) *Attorney, Agent, or Firm*—Fish & Richardson P.C.

(57) ABSTRACT

A random access memory device that partially discharges or precharges a column. The memory device has a memory array with a plurality of columns. Each column includes a plurality of memory cells and a first bitline. The precharge line connects the first bitline to a voltage source to precharge at least a portion of the memory cells in the column before a read operation. Pass devices are connected to the first bitlines from the columns and divide the memory cells into a first section on one side of the pass devices and a second section on an opposite side of the pass devices. If a memory cell in the first section is accessed, the control logic opens the pass device during the read operation so that memory cells in the first section are discharged and memory cells in the second section are not discharged during the read operation. If a memory cell in the second section is accessed, the control logic closes the pass device during the read operation so that memory cells in both the first and second sections are discharged during the read operation.

17 Claims, 6 Drawing Sheets

APPARATUS AND METHOD FOR A HIGH-SPEED MEMORY

BACKGROUND

The present invention is directed to an apparatus and method for precharging a high-speed memory.

Many applications have a need for high-speed random access memory (RAM), such as dynamic random access memory (DRAM) or static random access memory (SRAM). Such a memory is configured in rows and columns to provide an array of memory cells. Most memories can write or read multi-bit words to or from the memory array by accessing multiple adjacent columns in the memory array simultaneously. Conventional high-speed SRAMs use relatively "narrow" words, e.g., 8 or 16 bits. However, some applications have a need for high-speed memory that can access very wide words, e.g., 128 bits or more. For example, digital signal processors for communications applications need wide words in order to load a full packet of data into a processor module. As another example, high-powered word processing programs with long instructions may need to access data with very wide words.

Unfortunately, wide-word high-speed SRAMs can burn a large amount of power. Specifically, in an SRAM, one bit line for each memory cells being accessed needs to be discharged during each read operation. Since the wide-word SRAMs access a large number of columns simultaneously, a large number of bit lines need to be precharged and discharged for each read operation. Moreover, since the SRAM is operating at high speed, the memory array is being accessed for read operations at high frequencies, and the bit lines need to be precharged and discharged frequently. Due to the frequent read operations and the large number of bit lines that need to be precharged and discharged for each read operation, a conventional high-speed wide-word SRAM can consume a large amount of power. High power consumption can make a chip unsuitable for many battery-powered devices.

One prior art technique to reduce power consumption in SRAMs is to divide the memory array into multiple sections by columns and/or rows. Each section of the memory array is independently prechargeable. During a read operation, only the section of the memory being accessed is precharged. The remaining sections of the memory remain are left uncharged. Unfortunately, breaking the memory array into multiple independently prechargeable sections requires a large number of independent precharge lines and control gates and a large number of sense amplifiers. This increases the physical size (i.e., the required area on the chip) of the memory. In addition, the precharge lines, gates and sense amplifiers require a large number of interconnects, which may not be physically available on the chip.

SUMMARY

In one aspect, the invention is directed to a random access memory device. The memory device has a memory array, a precharge line, at least one pass device, and a control logic. The memory array has a plurality of columns, with each column including a plurality of memory cells and a first bitline. The precharge line connects the first bitline to a voltage source to precharge at least a portion of the memory cells in the column before a read operation. The pass device is connected to the first bitline and divides the memory cells into a first section on one side of the pass device and a second section on an opposite side of the pass device. The control logic opens the pass device during the read operation if a memory cell in the first section is accessed so that memory cells in the first section are discharged and memory cells in the second section are not discharged during the read operation, and closes the pass device during the read operation if a memory cell in the second section is accessed so that memory cells in both the first and second sections are discharged during the read operation.

Implementations of the invention may include one or more of the following features. The first section may be located on a side of the pass device nearer the precharge line, and the second section may be located on a side of the pass device farther from the precharge line. The precharge line may be electrically connected to a bottom of the column. The first section may be located below the pass device, and the second section may be located above the pass device. Output lines may be electrically coupled to the first bitline from each column. The first section may be located on a side of the pass device nearer the output line, and the second section may be located on a side of the pass device farther from the output line. The output lines may be electrically connected to the bottom of the columns. The pass device may be closed during precharging. Each column may have a second bitline, and a sense amplifier may be coupled to the first and second bitlines.

In another aspect, the invention may be directed to a random access memory device with a memory array having a plurality of columns. Each column includes a plurality of memory cells and a first bitline. A precharge line connects the first bitline of each column to a voltage source to precharge at least a portion of the memory cells in the column before a read operation. In each column, a plurality of N pass devices are connected to the first bitline. The pass devices dividing the memory cells into N+1 sections. There are a plurality of output lines, each output line electrically connected to an end of one of the first bit lines from one of the columns. A control logic opens the pass devices on a side of a section being accessed farther from the output lines during the read operation and closes the pass devices on a side of the section being accessed closer to the output lines during the read operation.

In another aspect, the invention is directed to a method of operating a random access memory device. In the method, at least a portion of a plurality of memory cells in a column of a memory array are precharged by connecting a bitline in the column to a voltage source. A pass device connected to the bit line divides the memory cells into a first section and a second section. An address of one of the plurality of memory cells to be accessed is determined for a read operation. The pass device is closed if a memory cell in the first section is to be accessed and opened if a memory cell in the second section is to be accessed. Then the memory cell is read.

In another aspect, the invention is directed to a random access memory device. The memory device has a memory array with a plurality of columns. Each column includes a plurality of memory cells and a bitline. A precharge line connects the bitlines to a voltage source to precharge at least a portion of the memory cells in the column before a read operation. At least one pass device is connected to the bitlines. The pass device divides the memory cells into a first section on a side of the pass device nearer the precharge line and a second section on a side of the pass device opposite the precharge line. A control logic opens the pass device during the read operation if a memory cell in the first section is to be accessed during the read operation so that the memory cells in the first section are precharged, and closes the pass device during precharging if a memory cell in the second section is to be accessed during the read operation so that the memory cells in the first and second sections are precharged.

Implementations of the invention may include the following features. The precharge line may be electrically connected to a bottom of the column. The first section may be located below the pass device, and the second section may be located above the pass device.

Potential advantages of implementations of the invention can include zero or more of the following. Power consumption in a high-speed wide-word memory, such as an SRAM, can be reduced, without significantly increasing the physical size of the memory. A controllable portion of a memory array in the SRAM can be precharged using a simple precharge control logic.

Other features and advantages of the invention will become apparent from the following description, which includes the drawings and the claims.

DETAILED DESCRIPTION

Figure 1:
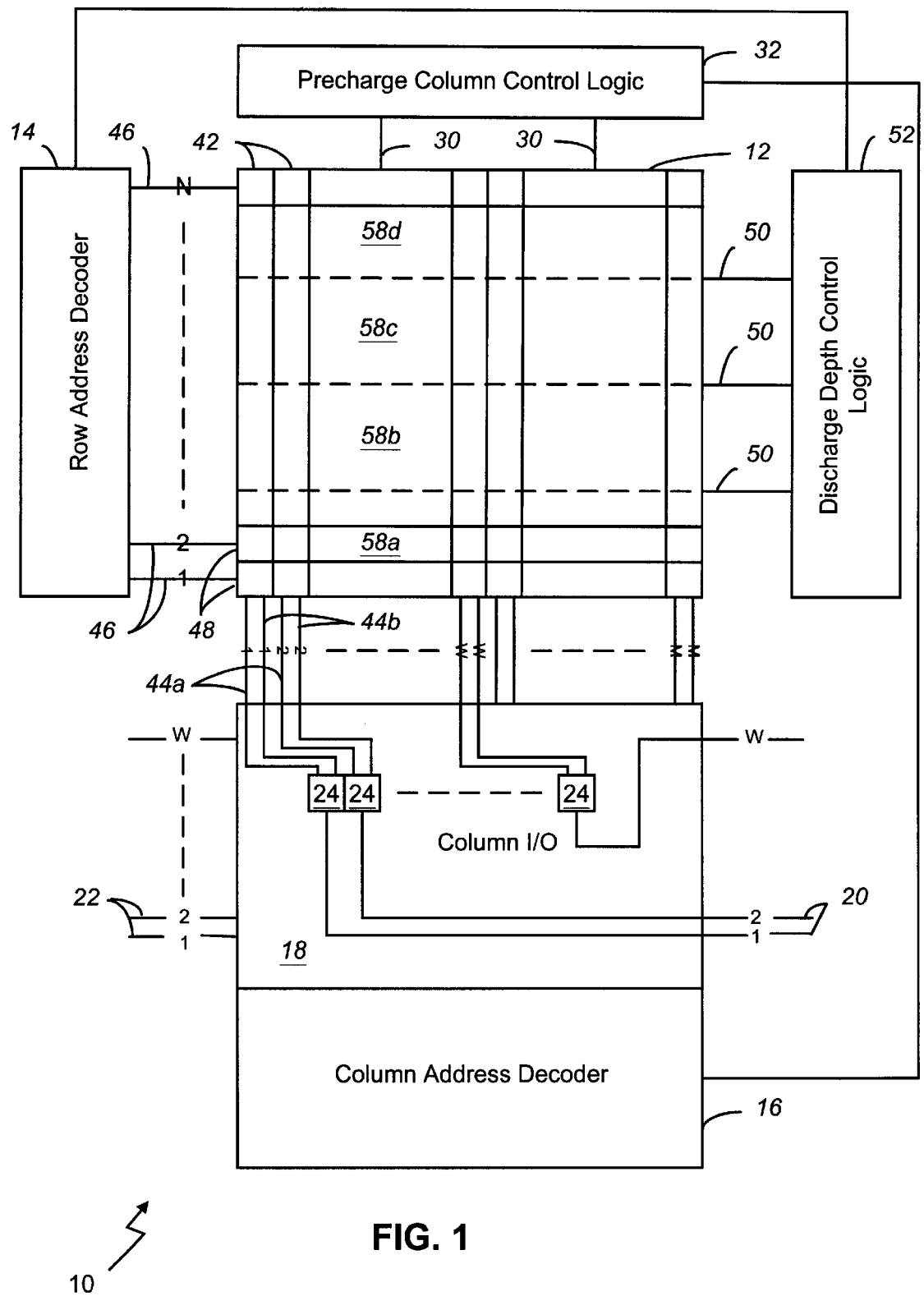
FIG. 1 is a block diagram of a random access memory constructed according to the present invention.

As shown in FIG. 1, a high-speed static random access memory device 10 includes a memory array 12, a row address decoder 14, a column address decoder 16, and a column input/output (I/O) block 18. The memory array 12 includes an array of memory cells 40 (see FIGS. 2 and 3) arranged in columns 42 and rows 48. The memory array 12 may be M columns wide and N rows deep. For example, M may be 136 and N may be 64.

Each column 42 in the memory array 12 includes a pair of bitlines 44a, 44b that are used for data input and output from the memory cells 40 in that column. The bitlines 44a and 44b are coupled to the column I/O block 18, which is configured to read a relatively wide multi-bit word from the memory cells 40 through the bitlines 44a, 44b onto the data output lines 20, or to write a relatively wide multi-bit word from the data input lines 22 through the bitlines 44a, 44b into the memory cells 40. The total number of bits W in the multi-bit word (and the corresponding number of data output lines 20 and data input lines 22) can be any number up to the total number of columns M. Optionally, the column I/O block 18 can include a number of sense amplifiers 24 equal to the word length W. During a read operation, each sense amplifier 24, if present, converts the signals from a bitline pair 44a, 44b in an associated column 42 into a high or low signal on an associated output line 20.

Assuming the number of columns M is greater than the word length W, the column address decoder 16 is used to select which set of logically adjacent columns 42 (the columns need not by physically adjacent) from the memory array 12 are accessed by the data output lines 20 or the data input lines 22 during a data read or write operation, respectively.

Figure 3:
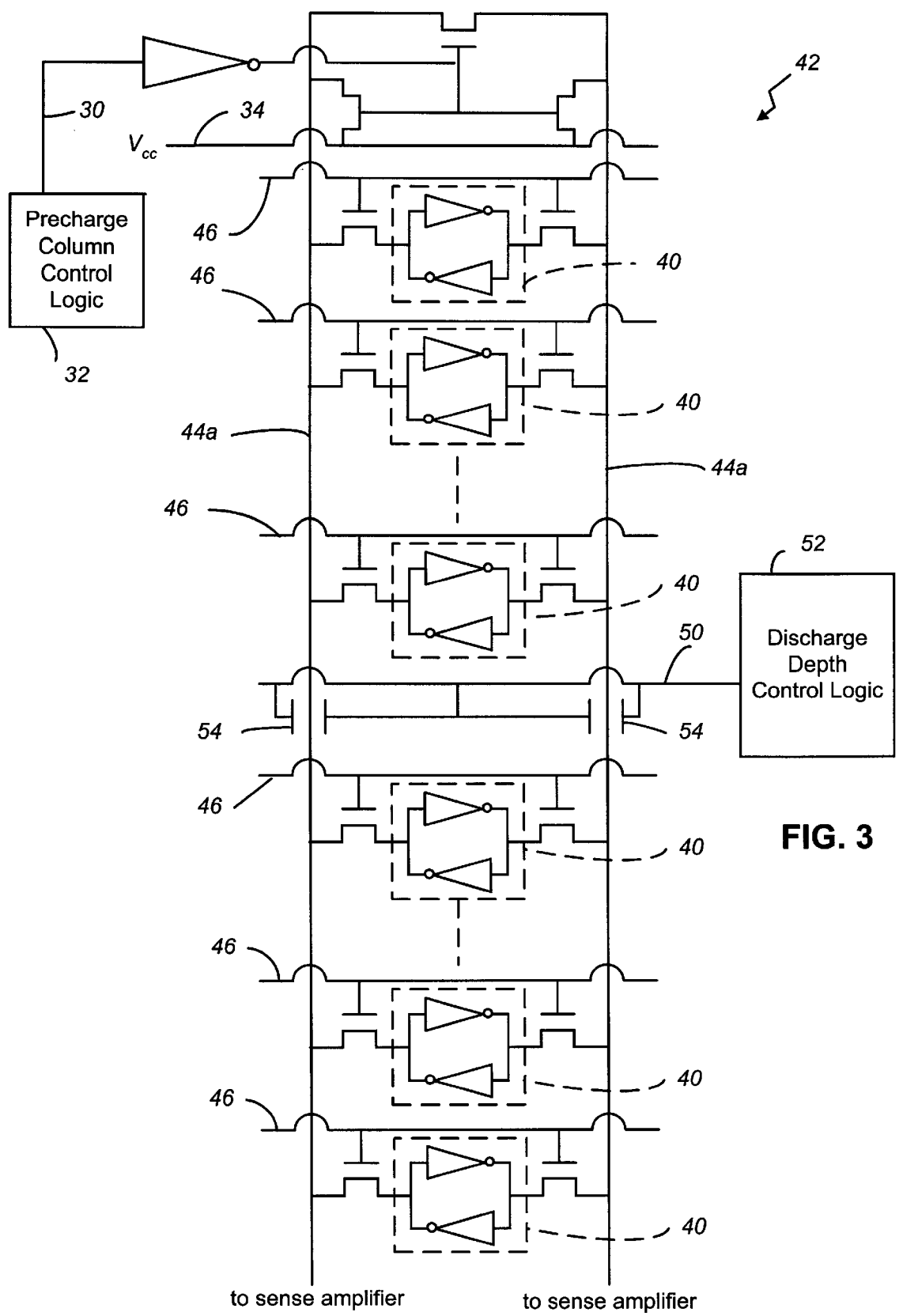
FIG. 3 is a schematic electrical diagram of a column from the memory array of FIG. 1.

Referring to FIGS. 1 and 3, the memory device 10 also includes one or more precharge lines 30 that are driven by a precharge column control logic 32 coupled to the column address decoder 16. Before a word is read from the memory array 12, the precharge logic 32 couples the top of the bitlines 44a, 44b to an input voltage source $V_{cc}$ with an input voltage line 34. This precharges the bitlines 44a, 44b and prevents loss of the data during the read operation.

The memory device 10 also includes one or more discharge depth control lines 50 that are driven by a discharge depth control logic 52 coupled to the row decoder 14. The maximum number of depth control lines 50 is N−1, but a typical number of depth control lines would be 3 or 7. As described in greater detail below, the discharge depth control lines 50 permit a controllable portion of each column to be discharged during a read operation, thereby conserving power.

Figure 2:
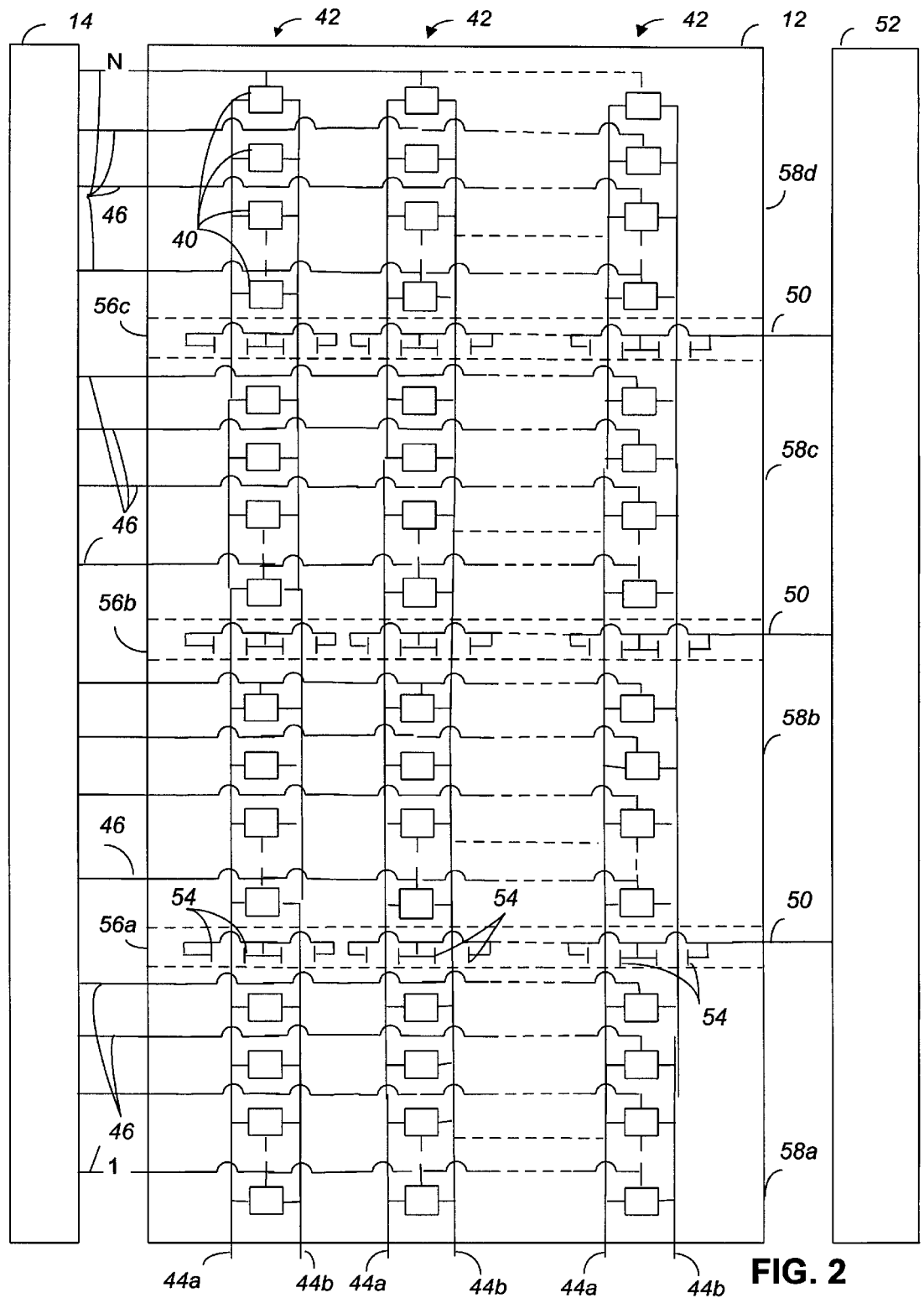
FIG. 2 is a schematic electrical diagram of a memory array from the random access memory of FIG. 1.

As shown in FIGS. 2 and 3, each column 42 includes a set of memory cells 40 stacked N deep, each accessed by an associated word line 46. The number of rows N in the memory array 12 can be 64, 128, or more. Each time that data in the column is to be read, the bit lines 44a, 44b are precharged with charge from the input voltage line 34. The precharge circuitry is then deactivated, and one of the word lines 46 is activated. Depending on the data in the cell 40 at the intersection of the word line 46 and the column 42, one bit line, e.g., bit line 44a, is pulled up to the input voltage $V_{cc}$ and the other bit line, e.g., bit line 44b, is pulled down to ground. Depending on the relative voltages on the bit lines 44a and 44b, the sense amplifier 24 associated with the column 42 outputs a high or low signal on the associated output line 20.

As shown in FIGS. 2 and 3, one or more pass devices 54 are inserted into each bit line 44a and 44b in each column 42. The pass devices 54 may be transmission gates. The pass devices 54 are arranged in horizontal rows 56a, 56b and 56c. In the illustrated implementation, there are three rows of pass devices 54 that divide the memory array 12 into four sections 58a–58d, each with an equal number of memory cells 40. However, there could be two or fewer pass devices, or four or more pass devices. For example, there could be just one pass device to divide the memory in two sections, or seven pass devices to divide the memory into eight sections.

Each horizontal row 56a–56c of pass devices 54 is controlled by one of the discharge depth control lines 50. The discharge depth control logic 52 controls the depth control lines 50 so that the pass devices 54 below the memory cells being addressed are opened (in the sense of an open switch breaking a circuit), during the read operation, and the pass devices 54 above the memory cells that will be addressed are closed (in the sense of a closed switch completing a circuit) during the read operation. Thus, in the implementation of FIGS. 2 and 3, if memory cells 40 in the first section 58a are accessed, the pass devices in rows 56a–56c are opened, and only the lower quarter of the column 42 is discharged. On the other hand, if memory cells 40 in the fourth section 58d are accessed, the pass devices in rows 56a–56c are closed, and the entire column is discharged. If memory cells 40 in the second section 58b are accessed, the pass devices in row 56a are closed and the pass devices in rows 56b and 56c are opened, so that the lower half of the column is discharge. If memory cells 40 in the third section 58c are accessed, the pass devices in the lower two rows 56a and 56b are closed and the pass devices in row 56c are opened, so that the lower three-quarters of the column is discharged.

To open the pass devices 54 above the addressed memory cells and close the pass devices 54 below the addressed memory cells, the discharge depth control logic 52 need only access the most significant and second most significant bits of the row address from the row address decoder 14.

When only a portion of the column is discharged, only a portion of the column needs to be recharged during the next precharge operation. Thus, the memory array 12 will draw one-quarter power when a memory cell in the first section 58a is accessed, half-power when a memory cell in the second section 58b is accessed, three-quarters power when a memory cell in third section 58c is accessed, and full power when a memory cell in the fourth section 54d is accessed. If $P_0$ is the base power drawn when an entire column is energized to read a word, the average power P consumed by the memory array 12 to read a word is $P=\frac{1}{4}(\frac{1}{4}+\frac{1}{2}+\frac{3}{4}+1)P_0=\frac{5}{8}P_0$.

If the memory device includes only a single row of pass devices 54 to divide the memory array in half, then the average power consumed by the memory array would be $\frac{1}{2}(\frac{1}{2}+1)P_0=\frac{3}{4}P_0$. On the other hand, as the number of rows of pass devices increases, the average power consumed by the memory array 12 drops asymptotically to $\frac{1}{2}P_0$.

The pass devices provide a simple mechanism to reduce power consumption with simple control algorithm. In addition, the control of the depth of the precharging on the columns can be implemented without complex connections of the columns to the input power source or large numbers of additional input power lines or control gates. Thus, power consumption can be reduced without significantly increasing the physical space needed for the memory array.

Figure 4:
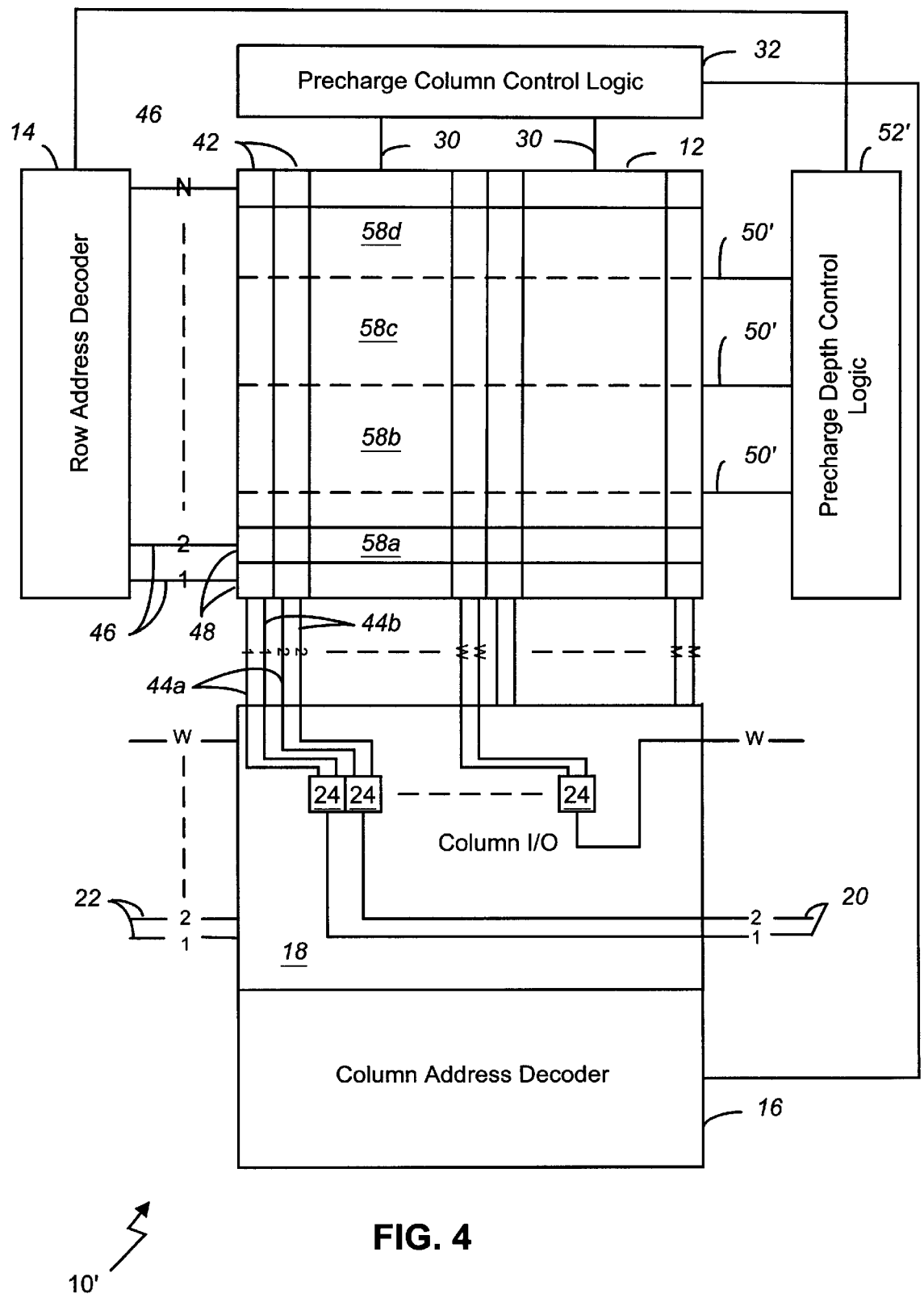
FIG. 4 is a block diagram of another implementation of a random access memory constructed according to the present invention.
Figure 5:
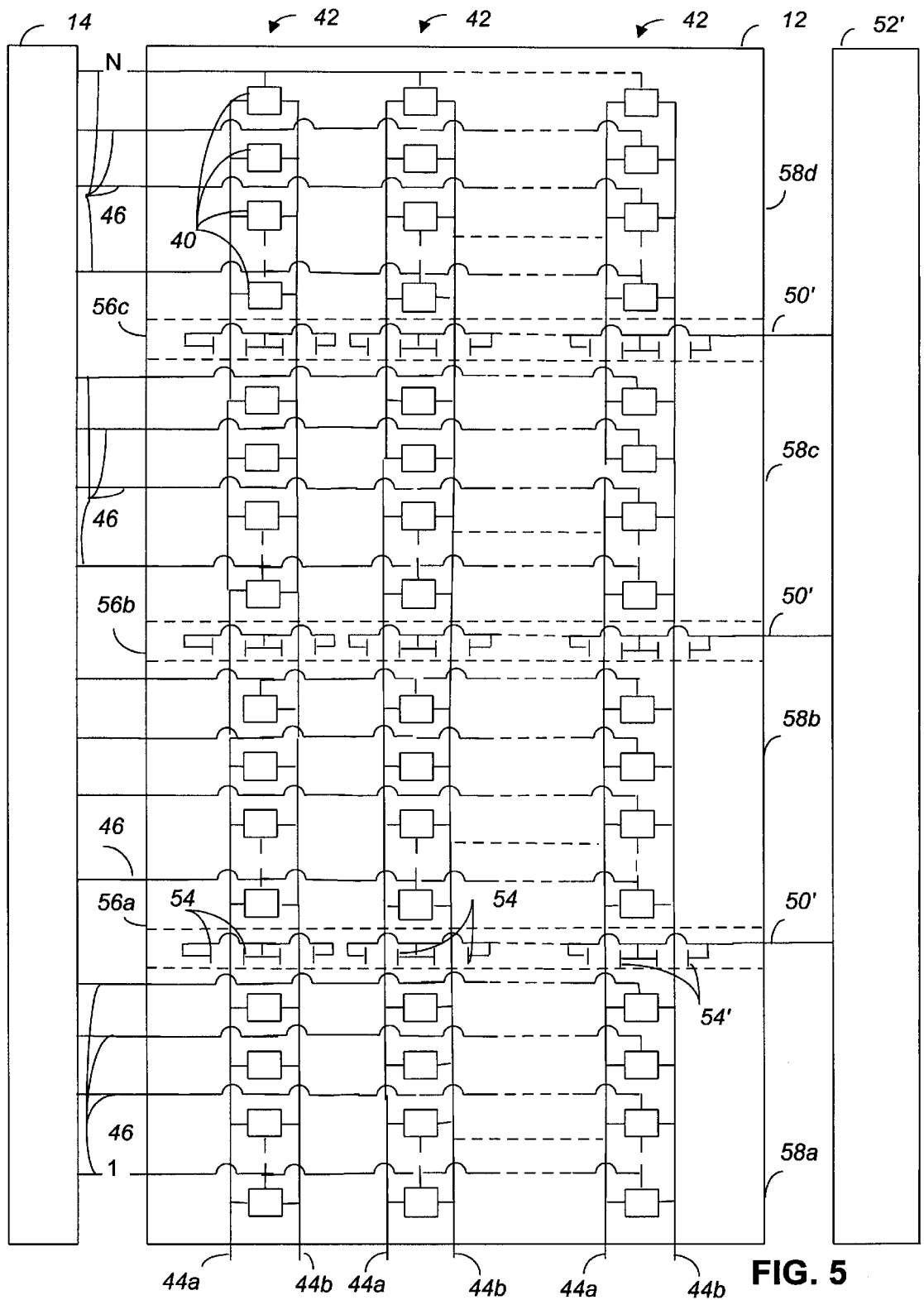
FIG. 5 is a schematic electrical diagram of a memory array from the static random access memory of FIG. 4.
Figure 6:
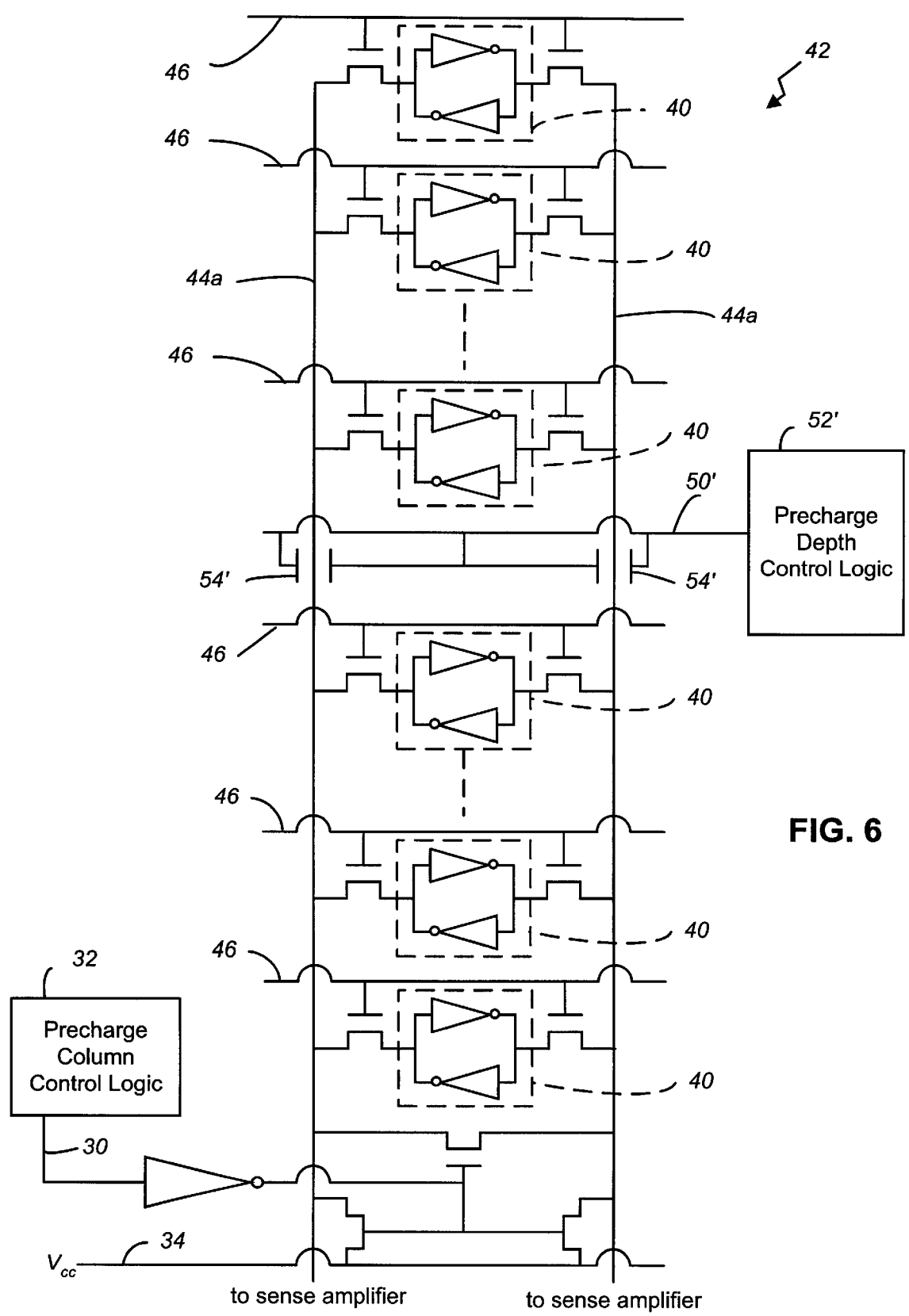
FIG. 6 is a schematic electrical diagram of a column from the memory array of FIG. 4.

In another implementation, the columns are partially precharged rather than partially discharged. Referring to FIGS. 4–6, in this implementation, the precharge logic 32 couples the bottom (rather than the top) of the bitlines 44a, 44b to the input voltage source $V_{cc}$. The memory device 10' includes one or more precharge depth control lines 50' that are driven by a precharge depth control logic 52' coupled to the row decoder 14. The precharge depth control lines 50' permit a controllable portion of each column to be precharged, thereby conserving power during read operations. The precharge depth control lines 50' control pass devices 54' arranged in fashion similar to the implementation of FIGS. 1–3.

The precharge depth control logic 52' controls the depth control lines 50' so that the pass devices 54' below the memory cells that will be addressed are closed during precharging and the pass devices 54' above the memory cells that will be addressed are opened during precharging. Of course, in order to determine which pass devices to open and close, the address of the memory cell being accessed would need to be loaded into the row address decoder 14 before the precharge step, which may require additional modifications to the timing elsewhere in the system.

In the implementation of FIGS. 4–6, if memory cells 40 in the first section 58a' are accessed, the pass devices in rows 56a'–56c' are open, and only the lower quarter of the column 42 is energized. On the other hand, if memory cells 40 in the fourth section 58d' are accessed, the pass devices in rows 56a'–56c' are closed, and the entire column is energized. If memory cells 40 in the second section 58b' are accessed, the pass devices in row 56a' are closed and the pass devices in rows 56b' and 56c' are opened, so that the lower half of the column is energized. If memory cells 40 in the third section 58c' are accessed, the pass devices in the lower two rows 56a' and 56b' are closed and the pass devices in row 56c' are opened, so that the lower three-quarters of the column is energized. Consequently, the memory array 12 will draw one-quarter power when a memory cell in the first section 58a' is accessed, half-power when a memory cell in the second section 58b' is accessed, three-quarters power when a memory cell in third section 58c' is accessed, and full power when a memory cell in the fourth section 54d' is accessed. Again, if $P_0$ is the base power drawn when an entire column is energized to read a word, the average power P consumed by the memory array 12 to read a word is $P=\frac{1}{4}(\frac{1}{4}+\frac{1}{2}+\frac{3}{4}+1)P_0=\frac{5}{8}P_0$.

The present invention has been described in terms of a preferred implementation. The invention, however, is not limited to the implementation depicted and described. Rather, the scope of the invention is defined by the appended claims.

What is claimed is:

1. A random access memory device, comprising:
   a memory array having a plurality of columns, each column including a plurality of memory cells and a first bitline;
   a precharge line to connect the first bitline of each column to a voltage source to precharge at least a portion of the memory cells in the column before a read operation;
   at least one pass device connected to the first bitline of each column, the pass device dividing the memory cells into a first section on one side of the pass device and a second section on an opposite side of the pass device; and
   control logic to open the pass device during the read operation if a memory cell in the first section is accessed so that memory cells in the first section are discharged and memory cells in the second section are not discharged during the read operation, and to close the pass device during the read operation if a memory cell in the second section is accessed so that memory cells in both the first and second sections are discharged during the read operation.

2. The memory device of claim 1, wherein the first section is located on a side of the pass device nearer the precharge line and the second section is located on a side of the pass device farther from the precharge line.

3. The memory device of claim 1, wherein the precharge line is electrically connected to the first bitline of each column at a bottom of each column.

4. The memory device of claim 3, wherein the first section is located below the pass device and the second section is located above the pass device.

5. The memory device of claim 1, further comprising an output line electrically coupled to the first bitline for each column.

6. The memory device of claim 5, wherein the first section is located on a side of the pass device nearer the output line and the second section is located on a side of the pass device farther from the output line.

7. The memory device of claim 6, wherein the output lines are electrically connected to the bottom of the columns.

8. The memory device of claim 7, wherein the first section is located below the pass device and the second section is located above the pass device.

9. The memory device of claim 1, wherein the pass device is closed during precharging.

10. The memory device of claim 1, further comprising a second bitline for each column.

11. The memory device of claim 10, further comprising a sense amplifier coupled to the first and second bitlines.

12. A random access memory device, comprising:
    a memory array having a plurality of columns, each column including a plurality of memory cells and a first bitline;

a precharge line to connect the first bitline of each column to a voltage source to precharge at least a portion of the memory cells in the column before a read operation;

in each column, a plurality of N pass devices connected to the first bitline, the pass devices dividing the memory cells into N+1 sections;

a plurality of output lines, each output line electrically connected to an end of one of the first bit lines from one of the columns; and control logic to open the pass devices on a side of a section being accessed farther from the output lines during the read operation and to close the pass devices on a side of the section being accessed closer to the output lines during the read operation.

13. The memory device of claim 12, wherein the plurality of pass devices are closed during precharging.

14. A method of operating a random access memory device, comprising:

precharging at least a portion of a plurality of memory cells in a column of a memory array by connecting a bitline in the column to a voltage source, a pass device connected to the bit line dividing the memory cells into a first section and a second section;

determining an address of one of the plurality of memory cells to be accessed for a read operation;

opening the pass device if a memory cell in the first section is to be accessed so that memory cells in the first section are discharged and memory cells in the second section are not discharged during the read operation and closing the pass device if a memory cell in the section is to be accessed so that memory cells in both the first and second sections are discharged during the read operation; and reading the memory cell.

15. A random access memory device, comprising:

a memory array having a plurality of columns, each column including a plurality of memory cells and a bitline;

a precharge line to connect the bitline of each column to a voltage source to precharge at least a portion of the memory cells in the column before a read operation;

at least one pass device connected to the bitline of each column, the pass device dividing the memory cells into a first section on a side of the pass device nearer the precharge line and a second section on a side of the pass device opposite the precharge line; and control logic to open the pass device during the read operation if a memory cell in the first section is to be accessed during the read operation so that the memory cells in the first section are precharged and to close the pass device during precharging if a memory cell in the second section is to be accessed during the read operation so that the memory cells in the first and second sections are precharged.

16. The memory device of claim 15, wherein the precharge line is electrically connected to a bottom of the column.

17. The memory device of claim 15, wherein the first section is located below the pass device and the second section is located above the pass device.

* * * * *